(12) United States Patent
Chen et al.

(10) Patent No.: US 7,558,072 B2
(45) Date of Patent: Jul. 7, 2009

(54) ADAPTER MODULE

(75) Inventors: Yueh-Chih Chen, Taipei (TW);
Kai-Shun Chang, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 540 days.

(21) Appl. No.: 11/339,582

(22) Filed: Jan. 26, 2006

(65) Prior Publication Data
US 2006/0171131 A1 Aug. 3, 2006

(30) Foreign Application Priority Data
Jan. 28, 2005 (TW) .............................. 94102783 A

(51) Int. Cl.
*H01R 12/16* (2006.01)
(52) U.S. Cl. .................. 361/785; 361/718; 361/719
(58) Field of Classification Search ................ 361/760, 361/748, 720, 759, 785, 683–688, 704, 717–719, 361/724; 312/223; 439/55, 65, 68, 70; 710/1, 710/5, 100, 300, 301, 302
See application file for complete search history.

(56) References Cited
U.S. PATENT DOCUMENTS

| | | | |
|---|---|---|---|
| 5,982,635 A * | 11/1999 | Menzies et al. ............. 361/790 |
| 6,176,709 B1 * | 1/2001 | Sonobe et al. ................ 439/69 |
| 6,421,783 B1 | 7/2002 | Liu et al. |
| 6,618,835 B1 * | 9/2003 | Garlapati et al. ............... 716/3 |
| 7,064,567 B2 * | 6/2006 | Schott et al. ................. 324/754 |
| 2005/0099768 A1 * | 5/2005 | Love .......................... 361/686 |
| 2006/0043947 A1 * | 3/2006 | Clavette et al. ............. 323/282 |

* cited by examiner

*Primary Examiner*—Hung S Bui
(74) *Attorney, Agent, or Firm*—Muncy, Geissler, Olds & Lowe, PLLC

(57) ABSTRACT

An adapter module is described. The adapter module includes a circuit board, a first socket and an adapter device. One face of the first socket is electrically connected to the circuit board on the first face of the circuit. The other face of the first socket connects to a first central processing unit (CPU). One face of the adapter base is electrically connected to the circuit board on the second face of the circuit board. The other face of the adapter base connects to a second socket. The circuit board sends signals from the second socket, through the adapter base and the first socket, to the first CPU. When the adapter base is not connected to the second socket, the second socket is capable of connecting to a second kind of CPU.

20 Claims, 4 Drawing Sheets

ADAPTER MODULE

RELATED APPLICATIONS

The present application is based on, and claims priority from, Taiwan Application Serial Number 94102783, filed Jan. 28, 2005, the disclosure of which is hereby incorporated by reference herein in its entirety.

FIELD OF THE INVENTION

The present invention relates to an adapter module, and more particularly, relates to an adapter module that is capable of connecting different types of central processing unit (CPU).

BACKGROUND OF THE INVENTION

Traditionally, a CPU is exclusively designed for use in either a motherboard of a desktop computer or in a laptop computer. The pin assignments and the working voltages of these two types of CPU are different; thus the two types are not interchangeable.

Compared to that of a desktop computer, the CPU of a laptop computer has several advantages, such as being smaller, quieter, saving more power, generating less heat and requiring a smaller fan for heat dissipation.

If a desktop computer was capable of utilizing a CPU originally used for the laptop computer, the volume of the desktop computer could be reduced and the noise and heat generated during operation could be minimized. However, the prior art desktop computer has no suitable device available for incorporating the laptop computer CPU.

Therefore, it is desirable to provide a suitable adapter module and a motherboard capable of utilizing these two types of CPU.

SUMMARY OF THE INVENTION

In one aspect, the present invention provides an adapter card that can make a desktop computer capable of utilizing a laptop computer CPU.

In another aspect, the present invention provides an adapter module and a motherboard that can make a desktop computer to have the advantages of being quieter, saving more power, generating less heat, saving space, and dispersing heat more efficiently.

In yet another aspect, the present invention provides an adapter module and a motherboard that can reduce the rotating speed of the heat dissipation fan of a desktop computer to save power and reduce the noise generated by the fan.

According to the aspects of the present invention, an exemplary adapter module is provided for a motherboard that has a second socket. The second socket has a plurality of pin terminals for a second CPU engaged thereon. In accordance with a preferred embodiment of the present invention, the adapter module comprises a circuit board, a first socket and an adapter device. The circuit board has a plurality of circuits that can transfer electrical signals from the first surface of the circuit board to the second surface thereof. The first socket having a plurality of pin terminals for a first CPU engaged thereon is electrically connected to the first surface of the circuit board, wherein the pin assignment of the first CPU is different from the second CPU. One surface of the adapter base is electrically connected to the second face of the circuit board. The other surface of the adapter base is engaged on a second socket to transfer a signal that is accepted by the second socket to the first CPU through the adapter device, the circuit board and the first socket sequentially.

When the adapter base is not connected with the second socket, the second socket is connected with the first CPU.

According to the aspects of the present invention, an exemplary motherboard capable of utilizing various types of CPU is provided. In accordance with one preferred embodiment of the present invention, the motherboard comprises a major circuit board, a second socket and an adapter module.

The second socket connected with the major circuit board has a plurality of pin terminals for connecting to a second CPU. The adapter module comprises an adapter circuit board, a first socket and an adapter device. The adapter circuit board has a plurality of circuits that can transfer electrical signals from the first surface of the adapter circuit board to the second surface thereof. The first socket having a plurality of pin terminals for connecting a first CPU is electrically connected with the first surface of the adapter circuit board, wherein the pin assignment of the first CPU is different from the second CPU. One face of the adapter base is electrically connected to the second face of the adapter circuit board. The other face of the adapter base connects a second socket to transfer a signal that is accepted by the second socket to the first CPU through the adapter device, the adapter circuit board and the first socket sequentially.

When the adapter base is not connected with the second socket, the second socket is used to connect the first CPU.

The advantages of the present invention are listed as follows, wherein each embodiment may include one or more advantages rather than all of them. The adapter module of the present invention can make a desktop computer capable of utilizing a CPU that is originally used in a laptop computer. In addition, the use of the adapter module and the motherboard of the present invention can provide a desktop computer the advantages that a laptop computer possesses, such as being quieter, saving more power, generating less heat, saving space and dispersing heat more efficiently. Furthermore, the adapter module and the motherboard of the present invention can reduce the rotating speed of the heat dissipation fan of a desktop computer to save power and reduce the noise generated by the fan.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
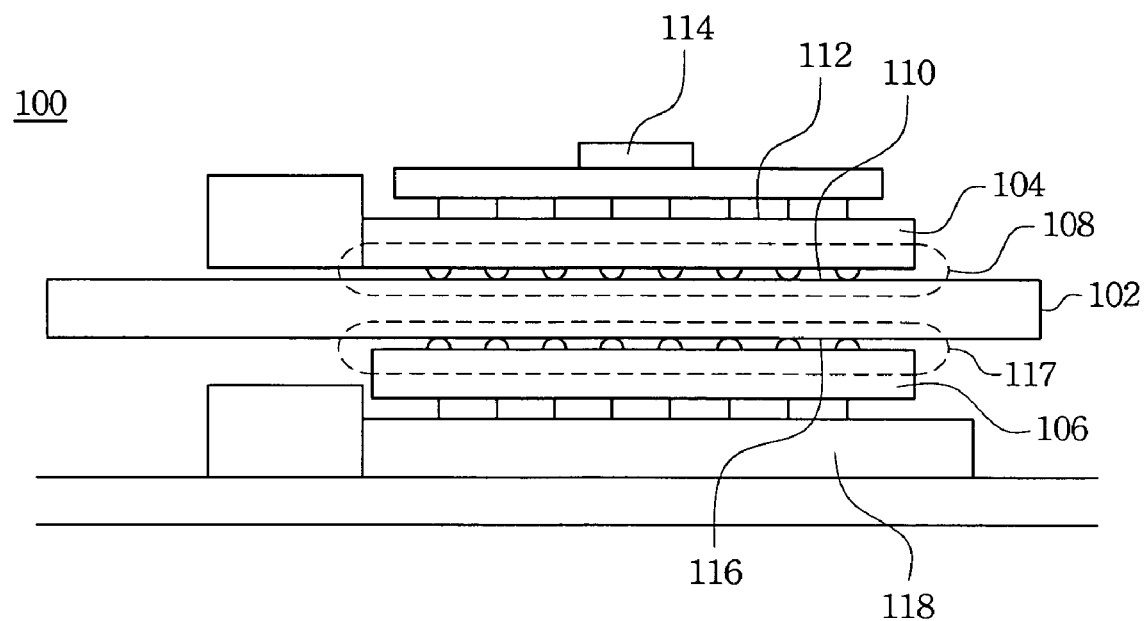
FIG. 1A is a side view of an adapter module in accordance with one preferred embodiment of the present invention.

FIG. 1A is a side view of the adapter module in accordance with one preferred embodiment of the present invention. The adapter module 100 comprises a circuit board 102, a first socket 104 and an adapter base 106. The circuit board 102 has a plurality of through-holes, wherein the first surface 110 of the circuit board 102 electrically connects with the second surface 116 thereof via a plurality of circuits through these through-holes.

Figure 1B:
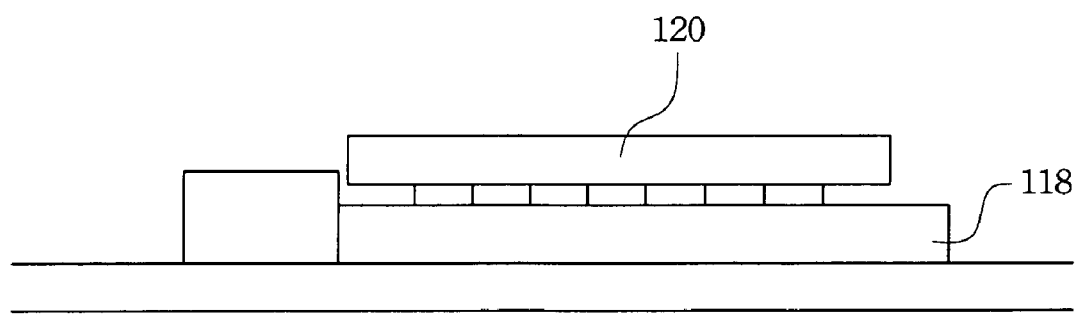
FIG. 1B is a side view of a second socket connected with a second CPU in accordance with one preferred embodiment of the present invention.

One surface of the first socket 104 and the first surface 110 of the circuit board 102 are connected by a first ball grid array (BGA) 108. The other surface 112 of the first socket 104 connects to a first CPU 114. A second BGA 117 connects one surface of the adapter base 106 with the second surface 116 of the circuit board 102, and a second socket connects to the other surface of the adapter base 106. It should be appreciated that the first BGA 108 and the second BGA 117 are just illustrative; any other interface used for electrical connection may be applied in the embodiments of the present invention. A signal is transferred from the second socket 118 to the first CPU 114 through the adapter base 106, the circuit board 102 and the first socket 104 sequentially FIG. 1B is a side view of the second socket 118 connected with a second CPU 120 in accordance with one preferred embodiment of the present invention. When the adapter base 106 is not connected with the second socket 118 in FIG. 1A, the second socket 118 is used to connect to a second CPU 120 in FIG. 1B, wherein the pin assignment of the first CPU 114 is different from the pin assignment of the second CPU 120.

Thus, although the second socket 118 is originally designed exclusively for the second CPU 120 (as shown in FIG. 1B), it is made available for the first CPU 114 (as shown in FIG. 1A) via the adapter module 100. Therefore, the design of the adapter module 100 can make the desktop computer capable of utilizing the laptop computer CPU that has different pin assignments with the desktop CPU. In some embodiments of the present invention, the circuit board 102 is called an adapter card.

In the present embodiment, the first CPU 114 is a CPU used for a laptop computer and the second CPU 120 is a CPU used for a desktop computer. For example, the first CPU 114 is an Intel® Centrino™ CPU provided by Intel Corporation and exclusively designed for a laptop computer; and the second CPU 120 is an Intel® Pentium® 4 CPU provided by Intel Corporation and exclusively designed for a desktop computer.

Since a CPU designed for laptop computer is usually smaller and requires less working voltage, so that less heat is generated during operation and requires a smaller fan for dispersing heat. Therefore, the use of the CPU is suitable for minimizing the size of a desktop computer.

For example, in the present embodiment, the Intel® Pentium® 4 CPU has 478 pins, and the Intel® Centrino™ CPU has 479 pins. Furthermore, the pin assignments of these two types of CPUs are different. It is desirable to provide a circuit board 102 for signal routing between these two types of CPUs, so that the Intel® Centrino™ CPU can be connected with the socket that is exclusively designed for the Intel® Pentium® 4 CPU.

Since the working voltage of a laptop computer CPU is different from the working voltage of a desktop computer CPU, the desktop computer needs a transforming circuit to transform the working voltage of a desktop computer CPU 120 into a voltage required for a laptop computer CPU 114.

Typically, a CPU provides a voltage-identification (VID) to its motherboard for applying a suitable working voltage during operation. The transforming circuit can thus include a built-in function to transform the VID provided by the first CPU 114 into the VID that is identifiable for the motherboard ordinarily supporting the second CPU 120. Then, the motherboard can provide the first CPU 114 with a suitable working voltage, wherein the transforming circuit has a built-in voltage identification-transforming sheet by which the VID is transformed.

In the present embodiment, the transforming circuit is a programmable logic device (PLD). In some other embodiments, the transforming circuit can be a switch or a jumper.

Figure 2A:
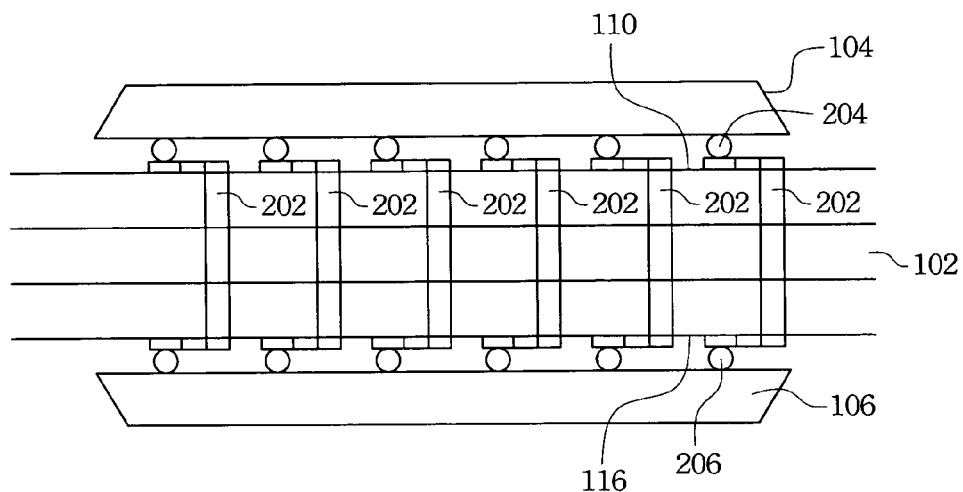
FIGS. 2A and 2B are cross-sectional views of different types of circuit board with a plurality of through-holes, in accordance with one preferred embodiment of the present invention.
Figure 2B:
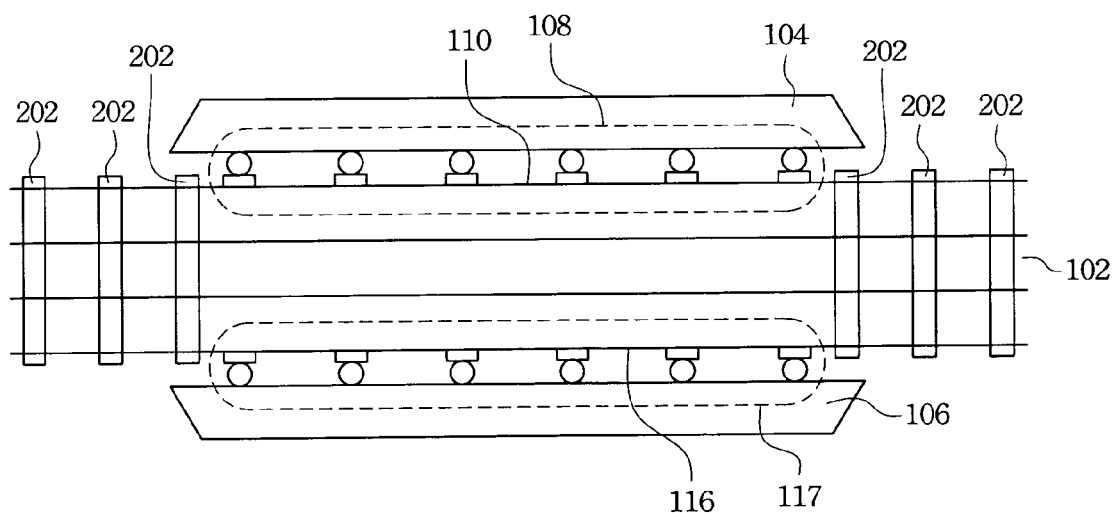

FIGS. 2A and 2B are cross-sectional views of different types of circuit board 102 with a plurality of through-holes 202, in accordance with preferred embodiments of the present invention.

Referring to FIG. 2A, circuits that run through the through-holes 202 connect the first socket 104 with the adapter base 106. For example, the first contact 204 connects with the second contact 206 via the shortest circuits that run through the through-hole 202.

Since the pins of the first socket 104 are not aligned with the adapter base 106, the regions where the BGAs are formed on the first surface 110 and the second surface 116 of the circuit board 102 must provide some space for the through-holes 202 which allow passage of the circuits. However, the through-holes 202 formed in the BGA regions may make the first surface 110 and the second surface 116 of the circuit board 102 to be too narrow to allow the circuits routing thereon. An alternative circuit board is provided to resolve the problems aforementioned.

Referring to FIG. 2B, the through-holes 202 are formed outside of the BGA regions (for setting the first BGA 108 and the second BGA 117), such that the first surface 110 and the second surface 116 of the circuit board 102 have enough space to allow the circuits routing thereon, wherein the circuits connect the first socket 104 and the adapter base 106 through the through-holes 202.

Figure 3:
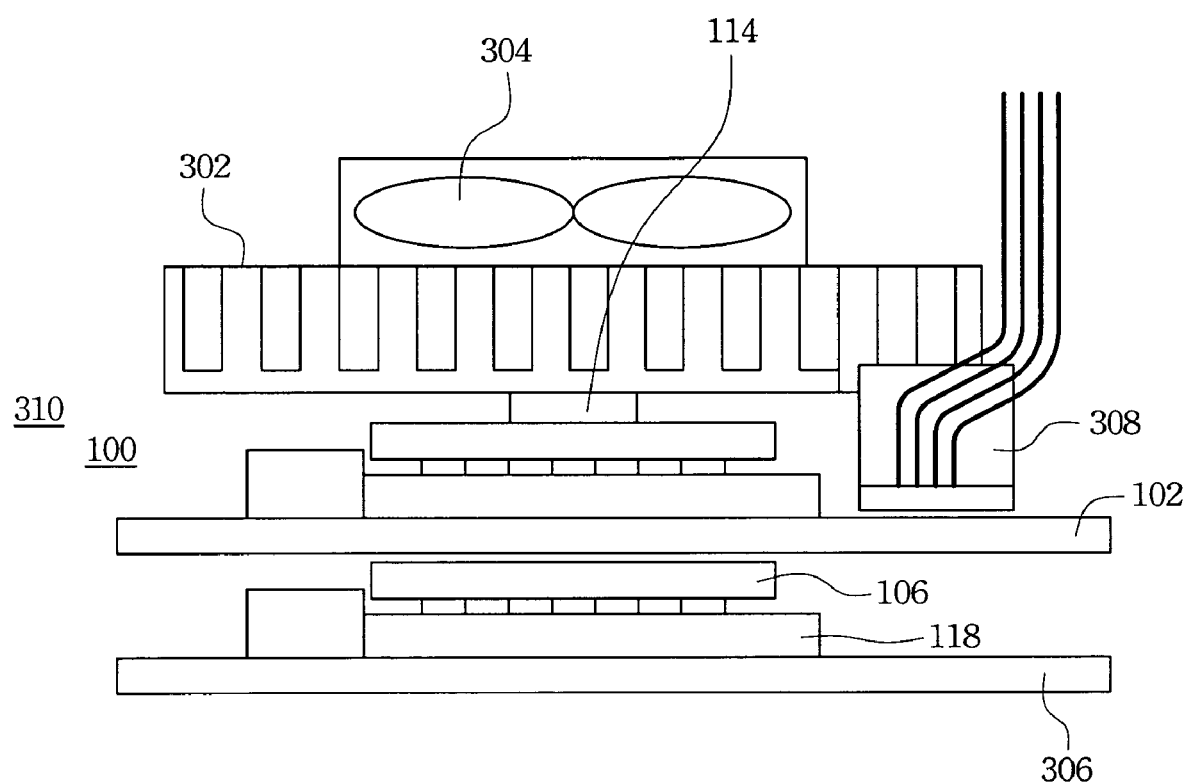
FIG. 3 is a side view of the adapter module in accordance with one preferred embodiment of the present invention.

FIG. 3 is a side view of the adapter module in accordance with one preferred embodiment of the present invention, wherein a heat dispersion module 302 having a fan 304 is applied on the adapter module 100. Because the first CPU 114 used for a laptop computer generates less heat than the second CPU 120 used for the desktop computer, the fan 304 requires less power and generates less noise. It should be noticed that the heat dispersion module 302 must be suitable for the thickness sum of the adapter module 100 and the first CPU 114. In addition, the circuit board 102 of the adapter module 100 should be smaller than a heat sink that is arranged with the second socket 118, so that there is enough space between the heat dispersion module 302 and the main board 306 to retain the adapter module 100 there between.

Besides the working voltage received via the adapter base 106, the first CPU 114 may require additional power. In one embodiment of the present invention, the adapter module 100 further comprises a power socket 308 to receive an outer power source. A regulator is further involved to transform the voltage of the outer power source to supply the first CPU with a specific working voltage.

Figure 4:
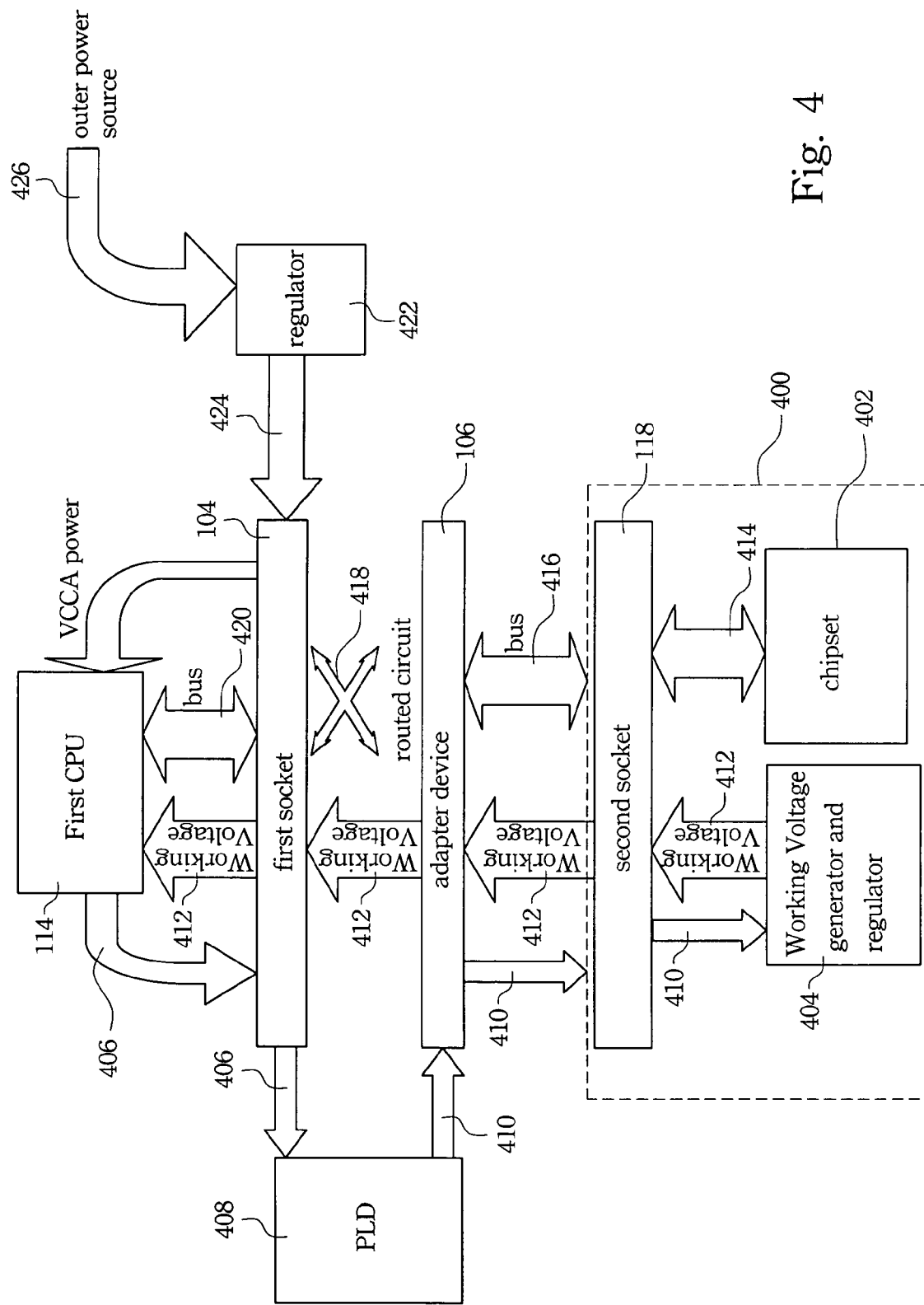
FIG. 4 is a functional diagram illustrating the functions of the adapter module, in accordance with one preferred embodiment of the present invention.

FIG. 4 is a functional diagram illustrating the functions of the adapter module 100 in accordance with one embodiment of the present invention. In FIG. 4, the motherboard has a chipset 402 designed for a desktop computer, a working voltage generator, and a regulator 404. When the first CPU 114 sends a VID 406 (that complies with the IVMP standard) to the first socket 104, the VID 406 is transferred to a PLD 408.

Subsequently, the VID 406 is transformed into another VID 410 that complies with the VRM10.1 standard. The VID 410 is then transferred to the working voltage generator and the regulator 404 to generate a suitable working voltage 412 for the first CPU 114. Finally, the working voltage 412 is transferred to the first CPU 114 via the second socket 118, the adapter base 106 and the first socket 104 sequentially.

In contrast, a signal sent from the chipset 402 can be transferred through the bus 414 to the second socket 118 and then transmitted through the bus 416, the adapter base 106, the routed circuit 418, the first socket 104 and the bus 420 to the first CPU 114 sequentially. Similarly, the signal sent from the first CPU 114 can also be transferred to the second socket 118 via the same route.

When the first CPU 114 needs additional power, an additional power may be provided by an external power source 426, wherein the external power source 426 is regulated and directed into the first socket 104 via the regulator 422 and then directed into the first CPU 114 after being regulated.

The adapter module 100 may be configured with the main board 306 to form a motherboard 310 which can provide new options for consumers and system builders. That is, consumers and system builder can choose from various types of CPU for their main board 306 depending on their requirements, such as volume, power and noise generation.

According to the description of the preferred embodiments, the adapter module 100 provides the following advantages. It should be noticed that every embodiment has at least one advantage and not necessarily all of them. The adaptor module 100 of the present invention can make a CPU that is designed for a laptop computer available for a desktop computer. In addition, the adapter module and the motherboard of the present invention can make a desktop computer to have the advantages of a laptop computer, such as being quieter, saving more power, generating less heat, saving space and dissipating heat highly efficiently. Furthermore, the adapter module and the motherboard of the present invention can reduce the rotating speed of the heat dissipation fan of a desktop computer to save power and reduce the noise generated by the fan.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An adapter module, comprising:
a circuit board having a plurality of circuits, used for transferring electrical signals from the first surface of the circuit board to the second surface thereof;
a first socket having a third surface electrically connecting to the first surface of the circuit board and a fourth surface having a plurality of pin terminals for connecting to a first CPU, which is designed for a laptop computer;
an adapter base, having a fifth surface that electrically connects to the second surface of the circuit board and a sixth surface that selectively connects to a second socket on a motherboard, the second socket having pin terminals for connecting a second CPU, which is designed for a desktop computer, wherein the pin assignment of the second CPU is different from that of the first CPU, when the second socket connects to the adapter base, signals received by the second socket are transferred to the first CPU via the adapter device, the circuit board, and the first socket sequentially.

2. The adapter module in accordance with claim 1, wherein the first socket connects to the first surface of the circuit board by a first ball grid array (BGA).

3. The adapter module in accordance with claim 1, wherein the adapter base connects to the second surface of the circuit board by a second BGA.

4. The adapter module in accordance with claim 1, further comprising a transforming circuit used to transform the working voltage between the first CPU and the second CPU.

5. The adapter module in accordance with claim 4, wherein the transforming circuit is a programmable logic device (PLD).

6. The adapter module in accordance with claim 4, wherein the transforming circuit has a built-in voltage identification (VID) transforming sheet by which to transform the VID of the first CPU into a VID that is identifiable for the motherboard ordinarily supporting the second CPU in order to provide the first CPU a suitable working voltage.

7. The adapter module in accordance with claim 4, wherein the transforming circuit is selected from a group consisting of a programmable logic device, a switch, a jumper and any arbitrary combination thereof.

8. The adapter module in accordance with claim 1, wherein the first socket connects to the first surface of the circuit board by a first BGA, the fifth surface of the adapter base connects to the second surface of the circuit board by a second BGA, and the circuit board has a plurality of through-holes allowing passage of circuits, wherein the through-holes are formed outside of the regions where the first BGA and the second BGA are formed.

9. The adapter module in accordance with claim 1, wherein the second socket has a heat sink larger than the circuit board of the adapter module.

10. The adapter module in accordance with claim 1, further comprising:
a power socket, for receiving an external power source;
a regulator, for transforming the voltage of the external power source to supply the first CPU a specific working voltage.

11. A motherboard having a function for supporting various types of CPU, the motherboard comprising:
a main board;
an adapter module comprising:
a circuit board having a plurality of circuits, used for transferring electrical signals from the first surface of the circuit board to the second surface thereof;
a first socket having a third surface electrically connecting to the first surface of the circuit board and a fourth surface having a plurality of pin terminals for connecting to a first CPU, which is designed for a laptop computer; and
an adapter base, having a fifth surface that electrically connects to the second face of the circuit board; and
a second socket having a plurality of pin terminals for selectively connecting to a second CPU, which is designed for a desktop computer, and a sixth surface of the adapter base, wherein the pin assignment of the first CPU is different from that of the second CPU, when the second socket connects to the adapter device, signals received by the second socket are transferred to the first CPU via the adapter device, the circuit board, and the first socket sequentially.

12. The motherboard in accordance with claim 11, wherein the first socket connects to the first surface of the circuit board by a first ball grid array (BGA).

13. The motherboard in accordance with claim 11, wherein the adapter base connects to the second surface of the circuit board by a second BGA.

14. The motherboard in accordance with claim 11, further comprising a transforming circuit used to transform the working voltage between the first CPU and the second CPU.

15. The motherboard in accordance with claim 14, wherein the transforming circuit is a programmable logic device (PLD).

16. The motherboard in accordance with claim 14, wherein the transforming circuit has a built-in VID transforming sheet by which to transform the VID of the first CPU into a VID that is identifiable for the motherboard ordinarily supporting the second CPU in order to provide the first CPU a suitable working voltage.

17. The motherboard in accordance with claim 14, wherein the transforming circuit is selected form a group consisting of a programmable logic device, a switch, a jumper, and the arbitrary combination thereof.

18. The adapter module in accordance with claim 11, wherein the first socket connects to the first surface of the circuit board by a first BGA, the fifth surface of the adapter base connects to the second surface of the circuit board by a second BGA, and the circuit board has a plurality of through-holes providing passage of circuits, wherein the through-holes are formed outside of the regions where the first BGA and the second BGA are formed.

19. The motherboard in accordance with claim 11, wherein the second socket has a heat sink larger than the circuit board of the adapter module.

20. The motherboard in accordance with claim 11, further comprising:
    a power socket, for receiving an external power source;
    a regulator, for transforming the voltage of the external power source to supply the first CPU a specific working voltage.

* * * * *